United States Patent
Choi

(10) Patent No.: US 9,500,923 B2
(45) Date of Patent: Nov. 22, 2016

(54) LIQUID CRYSTAL DISPLAY DEVICE AND METHOD OF FABRICATING THE SAME

(71) Applicant: LG Display Co., Ltd., Seoul (KR)

(72) Inventor: Hyuck Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 21 days.

(21) Appl. No.: 14/539,911

(22) Filed: Nov. 12, 2014

(65) Prior Publication Data

US 2015/0070610 A1    Mar. 12, 2015

Related U.S. Application Data

(63) Continuation of application No. 13/720,949, filed on Dec. 19, 2012, now Pat. No. 8,922,743.

(30) Foreign Application Priority Data

Mar. 14, 2012  (KR) .................. 10-2012-0025908

(51) Int. Cl.
| | | |
|---|---|---|
| *G02F 1/1343* | (2006.01) | |
| *G02F 1/1362* | (2006.01) | |
| *H01L 27/15* | (2006.01) | |
| *H01L 33/00* | (2010.01) | |
| *G02F 1/1333* | (2006.01) | |

(Continued)

(52) U.S. Cl.
CPC ....... *G02F 1/136286* (2013.01); *G02F 1/1368* (2013.01); *G02F 1/133345* (2013.01); *G02F 1/134336* (2013.01); *H01L 27/124* (2013.01); *H01L 27/156* (2013.01); *H01L 33/0041* (2013.01); *G02F 1/134363* (2013.01); *G02F 2001/134372* (2013.01)

(58) Field of Classification Search
CPC ............... G02F 1/134327; G02F 1/134309; G02F 1/133707; G02F 1/134306; G02F 2001/134345; G02F 1/33345; G02F 1/136286; H01L 27/156; H01L 33/0041
USPC ................. 349/142, 144, 138, 139
See application file for complete search history.

(56) References Cited

U.S. PATENT DOCUMENTS

| | | | |
|---|---|---|---|
| 7,589,881 B2 | 9/2009 | Sugiyama | |
| 8,922,743 B2 * | 12/2014 | Choi | ............. H01L 27/156 349/138 |

(Continued)

FOREIGN PATENT DOCUMENTS

| | | |
|---|---|---|
| CN | 1577013 A | 2/2005 |
| CN | 1637561 A | 7/2005 |

(Continued)

*Primary Examiner* — Mike Qi
(74) *Attorney, Agent, or Firm* — Birch, Stewart, Kolasch & Birch, LLP

(57) ABSTRACT

Discussed are a liquid crystal display device and a method of fabricating the same in which a single common line is formed at the center of a substrate, which results in an enhanced aperture ratio and transmittance. The liquid crystal display device includes a single common line located at a center of a substrate; a first group of unit pixels located in a right portion of the substrate on the basis of the common line and a second group of unit pixels located in a left portion of the substrate on the basis of the common line, each unit pixel defined by a plurality of gate lines and data lines orthogonally intersecting each other; and a plurality of thin film transistors formed at a right side of the respective unit pixels of the first group and at a left side of the respective unit pixels of the second group.

4 Claims, 10 Drawing Sheets

(51) Int. Cl.
 *G02F 1/1368* (2006.01)
 *H01L 27/12* (2006.01)

(56) References Cited

U.S. PATENT DOCUMENTS

| | | |
|---|---|---|
| 2005/0139837 A1 | 6/2005 | Lee et al. |
| 2006/0145983 A1 | 7/2006 | Lee et al. |
| 2007/0171319 A1 | 7/2007 | Fujita et al. |
| 2012/0249943 A1 | 10/2012 | Pai |
| 2013/0295701 A1 | 11/2013 | Ahn et al. |

FOREIGN PATENT DOCUMENTS

| | | |
|---|---|---|
| CN | 102207656 A | 10/2011 |
| GB | 2403336 A | 12/2004 |
| JP | 10-48595 A | 2/1998 |
| KR | 10-2007-0078389 A | 7/2007 |

* cited by examiner

LIQUID CRYSTAL DISPLAY DEVICE AND METHOD OF FABRICATING THE SAME

CROSS-REFERENCE TO RELATED APPLICATIONS

This application is a continuation of copending U.S. application Ser. No. 13/720,949 filed on Dec. 19, 2012, which claims the benefit of Korean Patent Application No. 10-2012-0025908, filed on Mar. 14, 2012. The contents of all of these applications are hereby incorporated by reference as fully set forth herein in their entirety.

BACKGROUND OF THE INVENTION

1. Field of the Invention

The present invention relates to liquid crystal display devices, and more particularly to a liquid crystal display device and a method of fabricating the same in which a single common line parallel to a gate line is formed at the center of a substrate, which may result in enhanced transmittance.

2. Discussion of the Related Art

Demands for display devices are gradually increasing with development of the information age. Correspondingly, a variety of flat panel display devices, such as a Liquid Crystal Display (LCD), Plasma Display Panel (PDP), Electro Luminescent Display (ELD), and Vacuum Fluorescent Display (VFD) devices, for example, have recently been studied and utilized as display devices in various equipment.

Among the aforementioned display devices, liquid crystal display devices currently have replaced Cathode Ray Tubes (CRTs) and been used as portable image display devices, owing to advantageous characteristics and advantages, such as high resolution, slim design, low weight and low power consumption. In addition to the purpose of portable appliances, such as monitors of laptop computers, liquid crystal display devices have been developed in various ways as monitors of computers and televisions that receive and display broadcast signals.

Such a liquid crystal display device includes a lower substrate on which a thin film transistor array is formed, an upper substrate on which a color filter array is formed, and a liquid crystal layer formed between the lower substrate and the upper substrate. Additionally formed on the lower substrate are a plurality of unit pixels defined by gate lines and data lines orthogonally intersecting each other, a plurality of pixel electrodes formed at the respective unit pixels to which data signals are individually applied, and thin film transistors to individually drive the pixel electrodes. Also, additionally formed on the upper substrate are color filters formed on a per unit pixel basis, a black matrix to prevent leakage of light, and column spacers to attain a gap between the upper substrate and the lower substrate.

Representative driving modes that have been used in the aforementioned liquid crystal display devices include, for example, a Twisted Nematic (TN) mode in which orientation of a liquid crystal director is twisted by 90 degrees and thereafter voltage is applied to control the liquid crystal director, and an In-Plane Switching (IPS) mode in which liquid crystals are driven by a horizontal electric field between pixel electrodes and common electrodes which are arranged in parallel on the same substrate.

In particular, in the in-plane switching mode, the pixel electrodes and the common electrodes are alternately formed on a lower substrate such that liquid crystals are oriented by a transversal electric field created between the pixel electrodes and the common electrodes. Although IPS mode liquid crystal display devices are beneficial to achieve a wider viewing angle, the IPS mode liquid crystal display devices have a low aperture ratio and transmittance. To solve this problem, Fringe Field Switching (FFS) mode liquid crystal display devices have been proposed.

In the case of FFS mode liquid crystal display devices, a plurality of pixel electrodes in the form of slits may be formed on a unitary common electrode, or a plurality of common electrodes in the form of slits may be formed on a unitary pixel electrode, whereby liquid crystal molecules are driven by a fringe field created between the pixel electrode(s) and the common electrode(s).

Hereinafter, a conventional liquid crystal display device will be described with reference to the accompanying drawings.

FIG. 1A is a plan view illustrating a conventional liquid crystal display device, and FIG. 1B is an enlarged plan view of a unit pixel of FIG. 1A, illustrating a fringe field switching mode liquid crystal display device.

Referring to FIGS. 1A and 1B, the conventional liquid crystal display device includes a plurality of gate lines GL and data lines DL that orthogonally intersect each other to define unit pixels on a substrate, and Thin Film Transistors (TFTs) formed at intersections of the gate lines GL and the data lines DL. In particular, the conventional liquid crystal display device further includes common lines CL provided equal in number to the gate lines GL and arranged parallel to the gate lines GL.

The TFT includes a gate electrode 10, source and drain electrodes 15a and 15b, and a semiconductor layer (not shown). The liquid crystal display device is a fringe field switching mode liquid crystal display device in which a fringe field is created by a unitary common electrode 30 and a plurality of pixel electrodes 20 in the form of slits with an insulating film interposed therebetween.

In this case, the pixel electrode 20 is connected to the drain electrode 15b through a drain contact hole 20a, and the common electrode 30 is connected to the common line CL through a common contact hole 30a. The above described conventional liquid crystal display device, however, is reduced in aperture ratio by an area of the common line CL in each unit pixel because the common lines CL are provided equal in number to the gate lines GL. In particular, a high-resolution display device has a less area of each unit pixel than a low-resolution display device, and therefore an area of the common line CL on a per unit pixel basis may be increased in the high-resolution display device than in the low-resolution display device, which causes a considerable reduction in transmittance.

SUMMARY OF THE INVENTION

Accordingly, the present invention is directed to a liquid crystal display device and a method of fabricating the same that substantially obviate one or more problems due to limitations and disadvantages of the related art.

An object of the present invention is to provide a liquid crystal display device and a method of fabricating the same in which a single common line parallel to gate lines is formed at the center of a substrate, which may result in an enhanced aperture ratio and transmittance.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a liquid crystal display device includes a single common line located at a center of a substrate; a first group of unit pixels located in a right portion of the substrate on the basis of the common line and a second group of unit pixels located in a left portion of the substrate on the basis of the common line, each unit pixel defined by a plurality of gate lines and data lines orthogonally intersecting each other; and a plurality of thin film transistors formed at a right side of the respective unit pixels of the first group and at a left side of the respective unit pixels of the second group.

Each gate line is located at the right side of the respective unit pixels in the first group of unit pixels, and each gate line is located at the left side of the respective unit pixels in the second group of unit, wherein the gate lines are parallel to the single common line.

Each unit pixel includes: a thin film transistor formed on the lower substrate; at least one of insulating film on the substrate including the thin film transistor; a common electrode on the at least one of insulating film to contact to the single common line, wherein the common electrode is formed over the entire surface of the lower substrate to have an opening corresponding to the thin film transistor; an third insulating film formed over the common electrode; and a pixel electrode formed on the third insulating film so as to be connected to the thin film transistor on a per unit pixel basis, wherein the pixel electrode and the common electrode create a fringe field therebetween with the third insulating film.

Each unit pixel includes: a thin film transistor formed on the lower substrate; at least one of insulating film on the substrate including the thin film transistor; a pixel electrode formed on the at least one of insulating film to connect to the thin film transistor on a per unit pixel basis; an third insulating film formed over the pixel electrode; and a common electrode on the third insulating film to contact to the single common line, wherein the common electrode is formed over the entire surface of the lower substrate to have an opening corresponding to the thin film transistor, wherein the pixel electrode and the common electrode create a fringe field therebetween with the third insulating film.

The pixel electrode or the common electrode is formed in a form of slits.

In accordance with another aspect of the present invention, a method of fabricating a liquid crystal display device, includes forming a plurality of gate lines having gate electrodes and a single common line which are parallel to the gate lines on a substrate; forming a gate insulating film on the substrate including the plurality of gate lines and the single common line; forming a semiconductor layer on the insulating film over the gate electrode; forming source and drain electrodes and a plurality of data lines, wherein the plurality of data lines orthogonally intersect with the plurality of gate lines to define a plurality of unit pixels, to form thin film transistors each including the gate electrode, the semiconductor layer and the source and drain electrodes; forming a first insulating film on the gate insulating film including the source and drain electrodes and the plurality of data lines; forming a common electrode on the entire surface of the first insulating film to have an opening in a region thereof corresponding to each thin film transistor, the common electrode being connected to the common line; forming a second insulating film on the first insulating film including the common electrode; and forming a pixel electrode on the second insulating film at a per unit pixel basis, the pixel electrode being connected to each thin film transistor.

Also, in accordance with another aspect of the present invention, a method of fabricating a liquid crystal display device, the method comprising: forming a plurality of gate lines having gate electrodes and a single common line which are parallel to the gate lines on a substrate; forming a gate insulating film on the substrate including the plurality of gate lines and the single common line; forming a semiconductor layer on the insulating film over the gate electrode; forming source and drain electrodes and a plurality of data lines, wherein the plurality of data lines orthogonally intersect with the plurality of gate lines to define a plurality of unit pixels, to form thin film transistors each including the gate electrode, the semiconductor layer and the source and drain electrodes; forming a first insulating film on the gate insulating film including the source and drain electrodes and the plurality of data lines; forming a pixel electrode on the first insulating film at a per unit pixel basis, the pixel electrode being connected to each thin film transistor; forming a second insulating film on the first insulating film including the pixel electrodes; and forming a common electrode on the entire surface of the second insulating film to have an opening in a region thereof corresponding to each thin film transistor, the common electrode being connected to the common line.

The single common line is formed at the center of the substrate.

The thin film transistors in a right portion of the substrate on the basis of the common line are located at a right side of the respective unit pixels, and thin film transistors in a left portion of the substrate on the basis of the common line are located at a left side of the respective unit pixels, The pixel electrode or the common electrode is formed in a form of slits.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, a liquid crystal display device of the present invention will be described in detail with reference to the accompanying drawings.

Figure 1A:
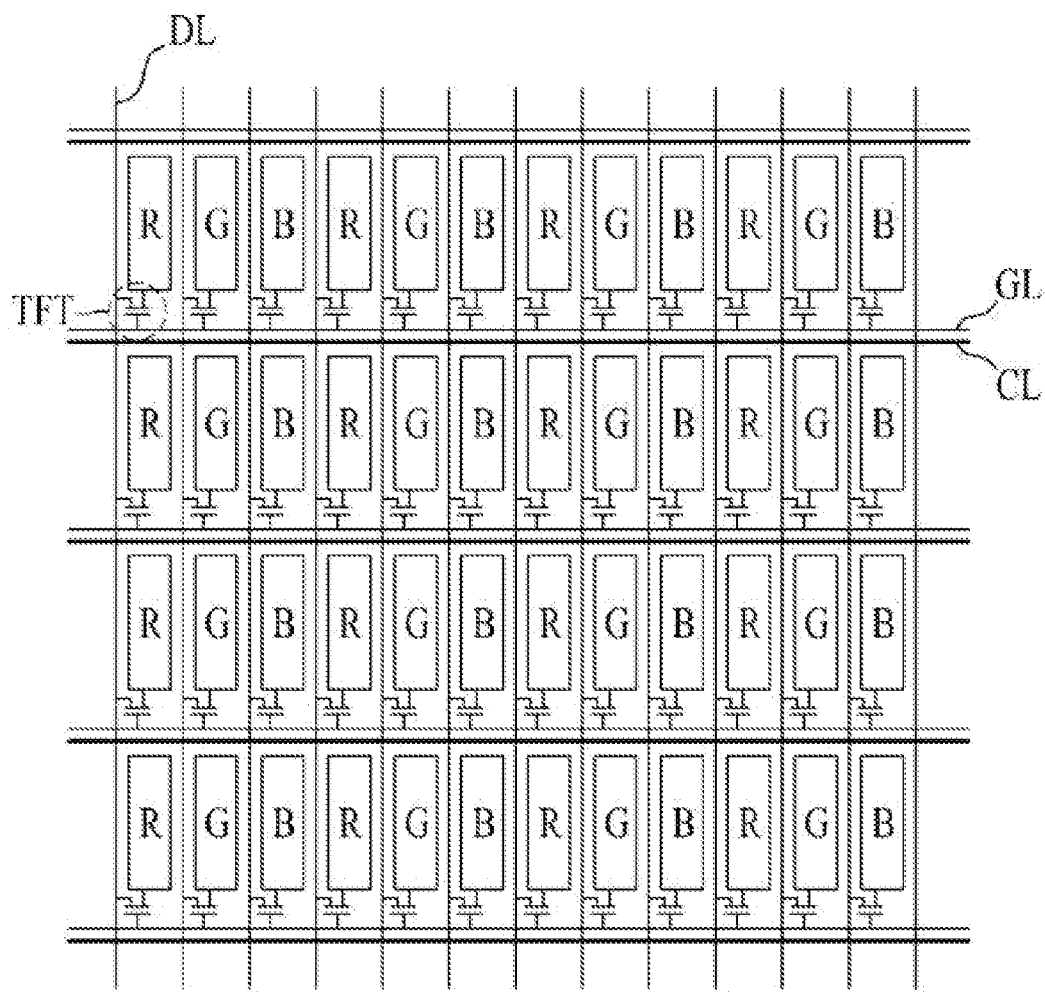
FIG. 1A is a plan view illustrating a conventional liquid crystal display device.
Figure 1B:
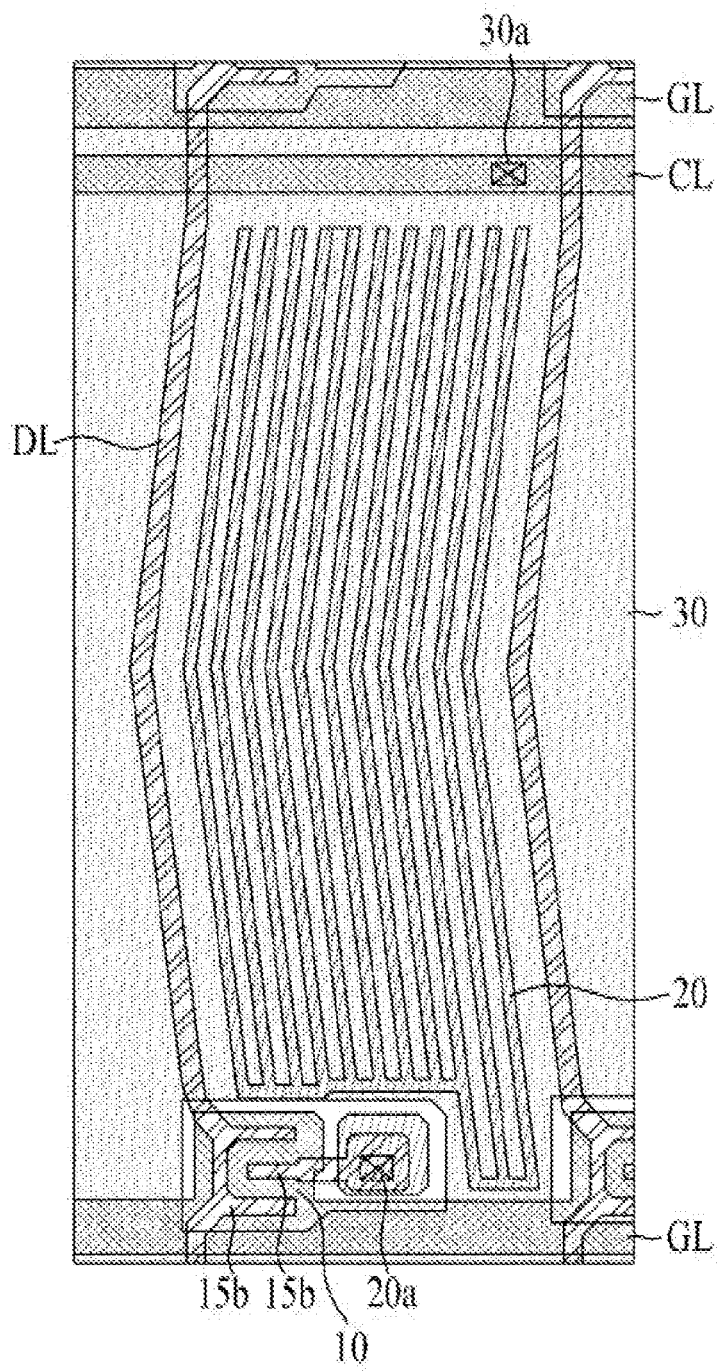
FIG. 1B is an enlarged plan view illustrating a unit pixel of FIG. 1A.
Figure 2A:
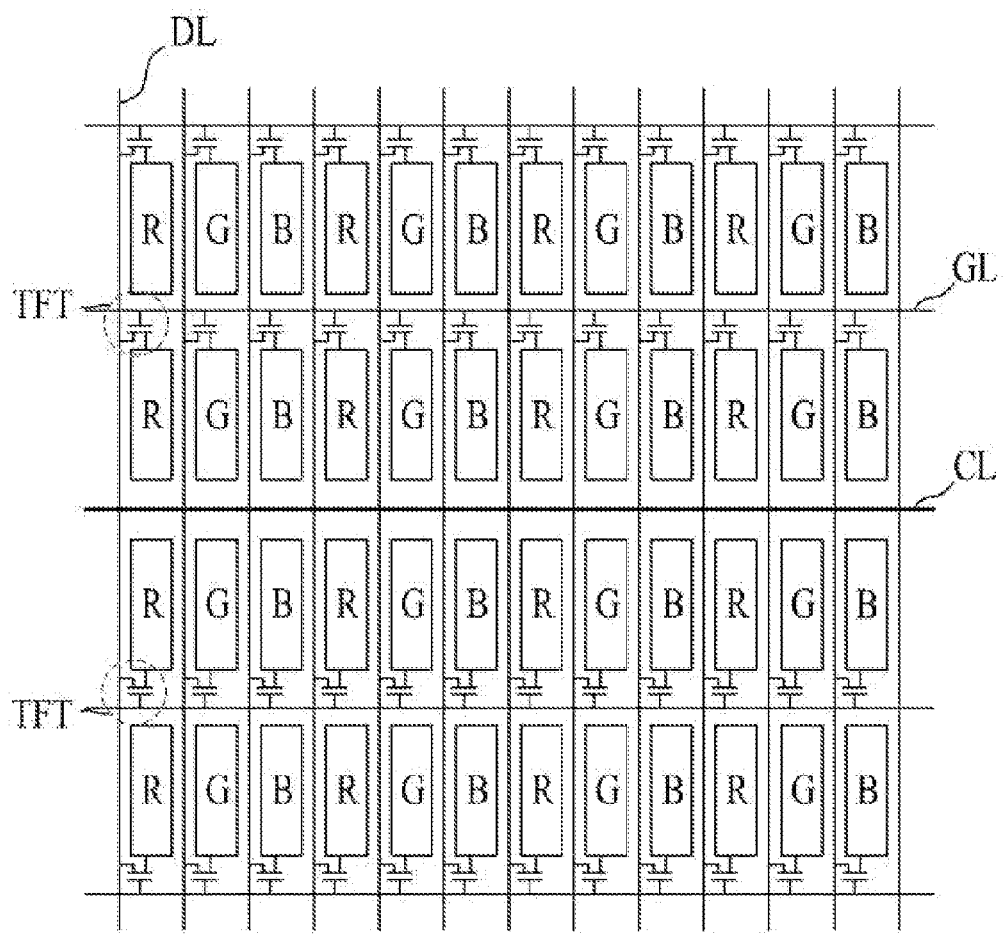
FIG. 2A is a plan view illustrating a liquid crystal display device according to the present invention.
Figure 2B:
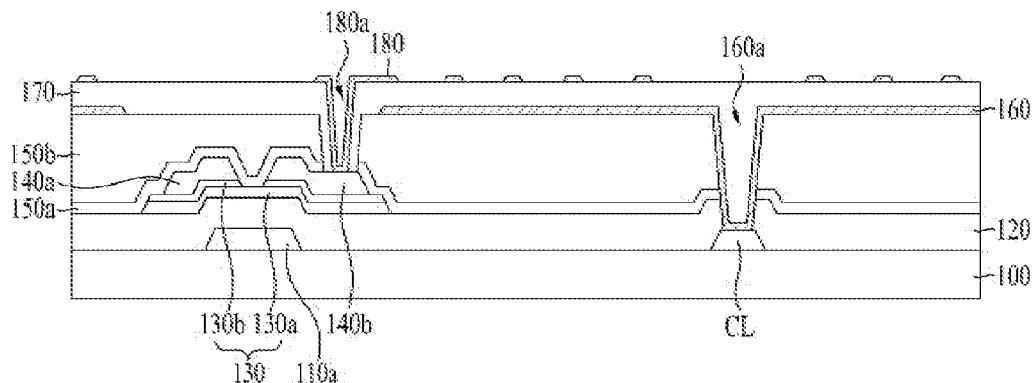
FIG. 2B is a sectional view illustrating a unit pixel adjacent to a common line of FIG. 2A according to a first embodiment of the present invention.

FIG. 2A is a plan view illustrating a liquid crystal display device according to the present invention, and FIG. 2B is a sectional view illustrating a unit pixel adjacent to a common line of FIG. 2A according to a first embodiment of the present invention.

As illustrated in FIG. 2A, the liquid crystal display device according to the present invention includes a first group of unit pixels and a second group of unit pixels formed respectively in a right portion and a left portion of the lower substrate on the basis of a center axis of the lower substrate, a plurality of Thin Film Transistors (TFTs) formed at a right side of the respective upper unit pixels of the first group and at a left side of the respective lower unit pixels of the second group, and a single common line CL located between the first group of unit pixels and the second group of unit pixels.

In the case of the previously described conventional liquid crystal display device, the common lines, which are equal in number to the gate lines, are formed on the lower substrate. However, since the common lines are formed of a light-shield metal, the conventional liquid crystal display device is reduced in aperture ratio by an area of the common line in each unit pixel. Moreover, a high-resolution display device has a less area of each unit pixel than a low-resolution display device, and therefore an area of the common line CL on a per unit pixel basis may be increased in the high-resolution display device than in the low-resolution display device, which causes a considerable reduction in transmittance.

Accordingly, to reduce the number of common lines to thereby achieve an enhanced aperture ratio, the liquid crystal display device of the present invention is configured such that the single common line CL is formed at the center of the lower substrate to extend parallel to gate lines GL.

More specifically, a plurality of gate lines GL and a plurality of data lines DL orthogonally intersect each other on the lower substrate to define a plurality of unit pixels. The unit pixels may be divided into a first group of unit pixels located in a right portion of the lower substrate on the basis of the center axis, and a second group of unit pixels located in a left portion of the lower substrate on the basis of the center axis.

The common line CL is formed between the first group of unit pixels and the second group of unit pixels. In this case, the common line CL is preferably formed at the center of the lower substrate. For example, if the common line CL is formed in the right portion of the lower substrate, delay of common voltage to be applied to the second group of unit pixels may occur. Conversely, if the common line CL is formed in the left portion of the lower substrate, delay of common voltage to be applied to the first group of unit pixels may occur.

In particular, to prevent the gate line GL from being formed near the common line CL, it is preferable that the TFTs for the first group of unit pixels be formed at the right side of the respective unit pixels of the first group and the TFTs for the second group of unit pixels be formed at the left side of the respective unit pixels of the second group. Also, in the first group of unit pixels, each gate line is located at the right side of the respective unit pixels. In the second group of unit pixels, each gate line is located at the left side of the respective unit pixels.

As illustrated in FIG. 2B, each unit pixel includes a TFT formed on the lower substrate 100, first and second insulating films 150a and 150b configured to cover the TFT, a common electrode 160 formed on the second insulating film 150b, a third insulating film 170 formed on the second insulating film 150b including the common electrode 160, and a pixel electrode 180 formed on the third insulating film 170 so as to be connected to the TFT, the pixel electrode 180 and the common electrode 160 creating a fringe field therebetween with the third insulating film 170 interposed therebetween. The pixel electrode 180 or the common electrode 160 is formed in a form of slits. The TFT includes a gate electrode 110a, source and drain electrodes 140a and 140b spaced apart from each other, and a semiconductor layer 130 in the form of a stack of an active layer 130a and an ohmic contact layer 130b. In this case, the gate electrode 110a may protrude from the gate line (not shown) such that a scan signal is applied from the gate line (not shown) to the gate electrode 110a. Alternatively, the gate electrode 110a may be defined as a partial region of the gate line (not shown).

A gate insulating film 120 is formed on an entire surface of the lower substrate 100 including the gate line and the gate electrode 110a. The active layer 130a on the gate insulating film 120 and overlaps the gate electrode 110a. Here, the gate insulating film 120 is formed of an inorganic insulating material, such as silicon oxide (SiOx) and silicon nitride (SiNx), for example. The ohmic contact layer 130b formed on the active layer 130a serves to reduce electric contact resistance between the source and drain electrodes 140a and 140b and the active layer 130a. The ohmic contact layer 130b between the source electrode 140a and the drain electrode 140b spaced apart from each other is removed to define a channel between the source electrode 140a and the drain electrode 140b.

The source electrode 140a is connected to the data line DL to receive a pixel signal applied from the data line DL. The drain electrode 140b is spaced apart from the source electrode 140a by a predetermined distance. That is, the drain electrode 140b is arranged to face the source electrode 140a with a channel interposed therebetween. The first insulting film 150a and the second insulting film 150b are sequentially formed on the gate insulating film 120 including the TFT and the data line DL. Preferably, the first insulting film 150a is an inorganic insulating film and the second insulting film 150b is an organic insulating film.

The common electrode 160 is formed on the second insulating film 150b using a transparent conductive material, such as Tin Oxide (TO), Indium Tin Oxide (ITO), Indium Zinc Oxide (IZO), and Indium Tin Zinc Oxide (ITZO), for example. The common electrode 160 is electrically connected to the common line CL through common contact holes 160a that are formed by selectively removing the first and second insulating films 150a and 150b and the gate insulating film 120. In particular, connecting the common electrode 160 to the common line CL through the plurality of common contact holes 160a may prevent delay of common voltage. In this case, the common electrode 160 is a unitary electrode formed over the entire surface of the lower substrate to have openings in regions corresponding to the respective TFTs.

The third insulating film 170 is formed on the entire surface of the second insulating film 150b including the common electrode 160, and the pixel electrode 180 is formed on the third insulating film 170 and is connected to the drain electrode 140b of the TFT on a per unit pixel basis. The pixel electrode 180, similar to the common electrode 160, is formed of a transparent conductive material and is connected to the drain electrode 140b through a drain contact hole 180a that is formed by selectively removing the first and second insulating films 150a and 150b and the third insulating film 170.

More particularly, the pixel electrode 180 takes the form of a plurality of slits and creates a fringe field with the common electrode 160 with the third insulating film 170 interposed therebetween. The fringe field causes rotation of liquid crystal molecules by dielectric anisotropy. Transmittance of light through unit pixels varies based on the degree of rotation of liquid crystal molecules, resulting in realization of images.

That is, with the liquid crystal display device of the present invention as described above, it is possible to minimize a reduction in aperture ratio due to common lines owing to providing the single common line CL parallel to the gate lines GL only at the center of the lower substrate 100. Further, with the configuration in which the TFTs for a group of the upper unit pixels located in the upper portion of the lower substrate 100 on the basis of the common line CL are formed at the upper side of the respective upper unit pixels, and the TFTs for a group of the lower unit pixels located in the lower portion of the lower substrate 100 on the basis of the common line CL are formed at the lower side of the respective lower unit pixels, no TFTs and no gate lines GL are present between the unit pixels at a position where the common line CL is formed, which may effectively enhance an aperture ratio and transmittance.

Hereinafter, a method of fabricating the liquid crystal display device according to the first embodiment of the present invention will be described with reference to the accompanying drawings.

FIGS. 3A to 3F are sectional views illustrating sequential operations of a method of fabricating the liquid crystal display device according to the first embodiment of the present invention.

Figure 3A:
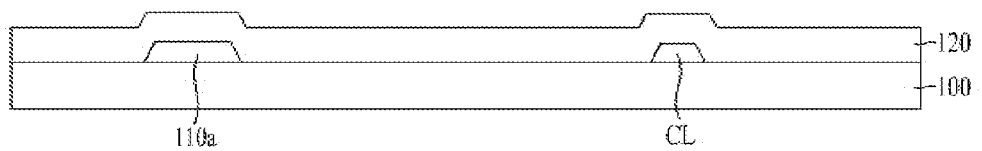
FIGS. 3A to 3F are sectional views illustrating sequential operations of a method of fabricating a liquid crystal display device according to the first embodiment of the present invention.

As illustrated in FIG. 3A, the plurality of gate lines (not shown) having gate electrodes 110a and the single common line CL are formed on the lower substrate 100. In this case, the common line CL is formed at the center of the lower substrate 100, and is arranged parallel to the plurality of gate lines (not shown). The gate electrode 110a may protrude from the gate line (not shown), or may be defined as a partial region of the gate line (not shown).

Figure 3B:
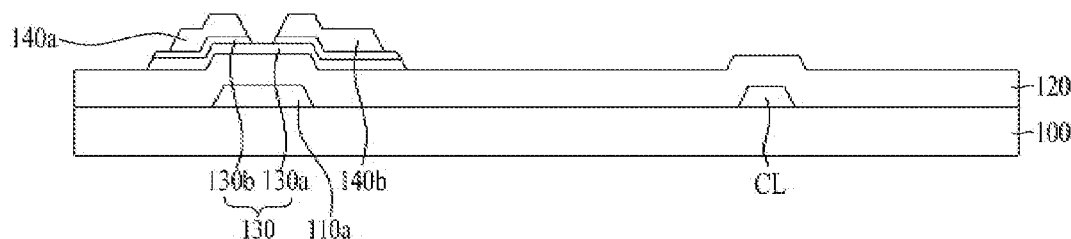

Next, as illustrated in FIG. 3B, the gate insulating film 120 is formed on the entire surface of the lower substrate 100 including the gate line (not shown), gate electrode 110a and the common line CL. Then, the semiconductor layer 130 in the form of a stack of the active layer 130a and the ohmic contact layer 130b is formed on the insulating film 120 over the gate electrode 110a. Then, the data lines (not shown) and the source and drain electrodes 140a and 140b spaced apart from each other are formed on the semiconductor layer 130. In this case, when using a half tone mask or a diffractive exposure mask, the semiconductor layer 130, the source and drain electrodes 140a and 140b and the data lines (not shown) may be simultaneously formed.

In this case, the plurality of data lines (not shown) and gate lines (GL) are formed to orthogonally intersect each other such that the plurality of unit pixels is defined at intersections of the data lines (not shown) and the gate lines (not shown). In this way, the TFT including the gate electrode 110a, the gate insulating film 120, the semiconductor layer 130, and the source and drain electrodes 140a and 140b is formed.

In the above described liquid crystal display device of the present invention in which the single common line CL is formed at the center of the lower substrate 100, it is preferable that the TFTs for a first group of unit pixels located in the right portion of the lower substrate 100 on the basis of the common line CL be formed at the right side of the respective upper unit pixels of the first group, and the TFTs for a second group of unit pixels located in the left portion of the lower substrate 100 on the basis of the common line CL be formed at the left side of the respective lower unit pixels of the second group.

Accordingly, only the single common line CL is formed between the first group of unit pixels and the second group of unit pixels, which may contribute to effectively enhance an aperture ratio and transmittance.

Figure 3C:
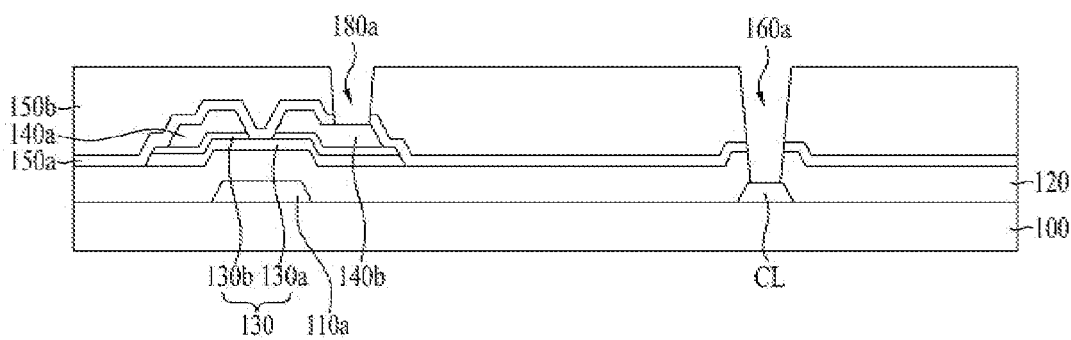

Next, as illustrated in FIG. 3c, the first and second insulating films 150a and 150b are formed on the entire surface of the gate insulating film 120 including the TFT. The first and second insulating films 150a and 150b are selectively removed to expose the drain electrode 140b to form the drain contact hole 180a. Simultaneously, The gate insulating film 120 and the first and second insulating films 150a and 150b are o selectively removed to expose the common line CL to form the common contact hole 160a.

Figure 3D:
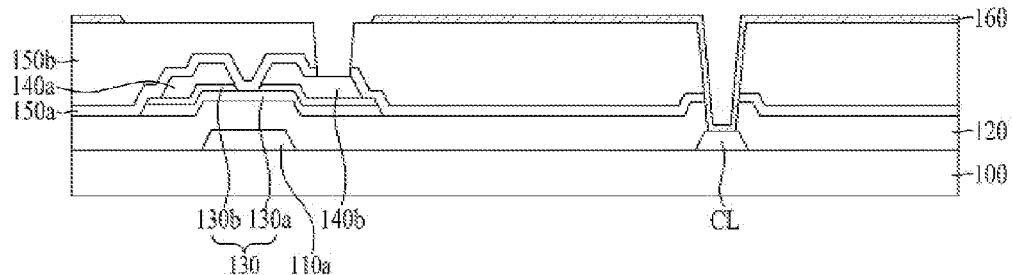

As illustrated in FIG. 3D, a transparent conductive material, such as Tin Oxide (TO), Indium Tin Oxide (ITO), Indium Zinc Oxide (IZO), and Indium Tin Zinc Oxide (ITZO), for example, is deposited over the entire surface of the second insulating film 150b including the common contact hole 160a. Then, the common electrode 160 is formed as the deposited transparent conductive material is patterned. The common electrode 160 is connected to the common line CL through the common contact hole 160a such that common voltage is applied to the common electrode 160. The common electrode 160 is a unitary electrode having openings corresponding to the respective TFTs.

Figure 3E:
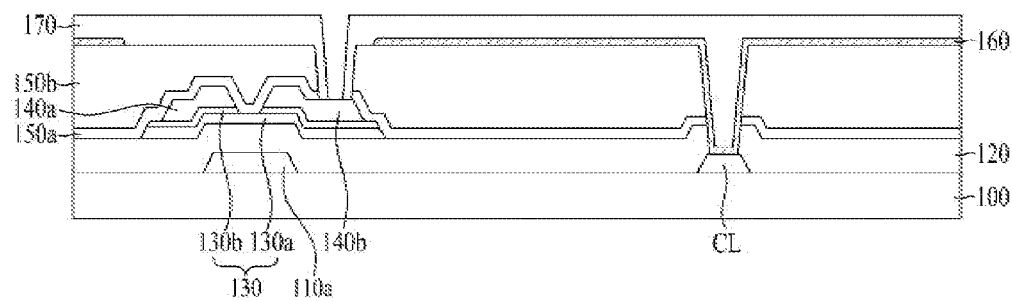

Next, as illustrated in FIG. 3E, the third insulating film 170 is formed over the entire surface of the second insulating film 150b containing the common electrode 160. The insulating film 170 corresponding to the drain contact hole 180a is removed to expose the drain electrode 140b. At this time, the drain contact hole 180a is not formed in FIG. 3c, the drain contact hole 180a may be formed by selectively removing the first, second and third insulating films 150a, 150b and 170 to expose the drain electrode 150b.

Figure 3F:
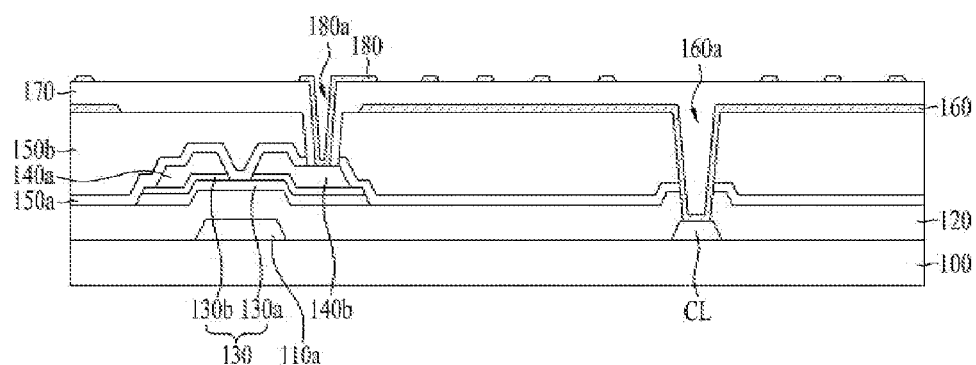

Next, as illustrated in FIG. 3F, a transparent conductive material as described above is deposited on the third insulating film 170 and is patterned to form the pixel electrode 180 in the form of slits to be connected to the drain electrode 140b. The pixel electrode 180 overlaps the common electrode 160 with the third insulating film 170 interposed therebetween to create a fringe field.

FIG. 2B illustrates that the pixel electrode 180 is formed over the common electrode 160. Alternatively, the common electrode 160 may be formed over the pixel electrode 180.

Figure 6:
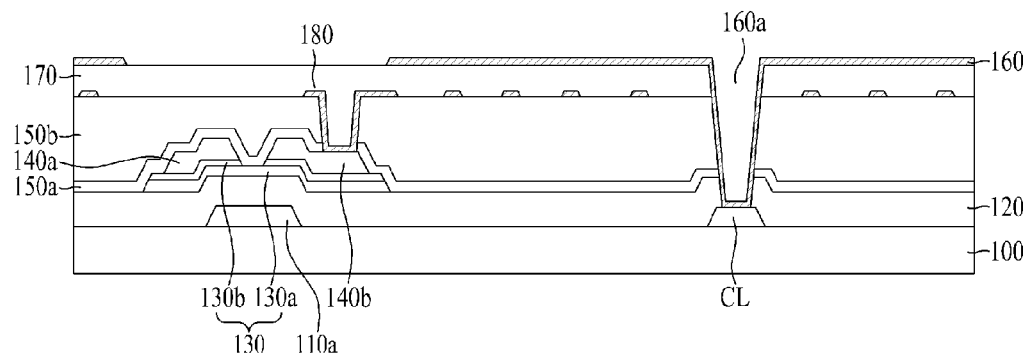
FIG. 6 is a sectional view illustrating a unit pixel adjacent to a common line of FIG. 2A according to a second embodiment of the present invention.

FIG. 6 is a sectional view illustrating a unit pixel adjacent to a common line of FIG. 2A according to a second embodiment of the present invention. FIGS. 7A to 7F are sectional views illustrating sequential operations of a method of fabricating the liquid crystal display device according to the second embodiment of the present invention.

As illustrated in FIG. 6, each unit pixel includes a TFT formed on the lower substrate 100, first and second insulating films 150a and 150b configured to cover the TFT, a pixel electrode 180 formed on the second insulating film 150b, a third insulating film 170 formed on the second insulating film 150b including the pixel electrode 180, and a common electrode 160 formed on the third insulating film 170 so as to be connected to the common line CL, the pixel electrode 180 and the common electrode 160 creating a fringe field therebetween with the third insulating film 170 interposed therebetween. The pixel electrode 180 or the common electrode 160 is formed in a form of slits. The TFT includes a gate electrode 110a, source and drain electrodes 140a and 140b spaced apart from each other, and a semiconductor layer 130 in the form of a stack of an active layer 130a and an ohmic contact layer 130b. In this case, the gate electrode 110a may protrude from the gate line (not shown) such that a scan signal is applied from the gate line (not shown) to the gate electrode 110a. Alternatively, the gate electrode 110a may be defined as a partial region of the gate line (not shown).

A gate insulating film 120 is formed on an entire surface of the lower substrate 100 including the gate line and the gate electrode 110a. The active layer 130a on the gate insulating film 120 and overlaps the gate electrode 110a. Here, the gate insulating film 120 is formed of an inorganic insulating material, such as silicon oxide (SiOx) and silicon nitride (SiNx), for example. The ohmic contact layer 130b formed on the active layer 130a serves to reduce electric contact resistance between the source and drain electrodes 140a and 140b and the active layer 130a. The ohmic contact layer 130b between the source electrode 140a and the drain electrode 140b spaced apart from each other is removed to define a channel between the source electrode 140a and the drain electrode 140b.

The source electrode 140a is connected to the data line DL to receive a pixel signal applied from the data line DL. The drain electrode 140b is spaced apart from the source electrode 140a by a predetermined distance. That is, the drain electrode 140b is arranged to face the source electrode 140a with a channel interposed therebetween. The first insulting film 150a and the second insulting film 150b are sequentially formed on the gate insulating film 120 including the TFT and the data line DL. Preferably, the first insulting film 150a is an inorganic insulating film and the second insulting film 150b is an organic insulating film.

The pixel electrode 180 is formed on the second insulating film 150b using a transparent conductive material, such as Tin Oxide (TO), Indium Tin Oxide (ITO), Indium Zinc Oxide (IZO), and Indium Tin Zinc Oxide (ITZO), for example. The pixel electrode 180 is formed on a per unit pixel basis. The pixel electrode 180 is connected to the drain electrode 140b through a drain contact hole 180a that is formed by selectively removing the first and second insulating films 150a and 150b.

The third insulating film 170 is formed on the entire surface of the second insulating film 150b including the pixel electrode 180, and the common electrode 160 is formed on the third insulating film 170. The common electrode 160 is electrically connected to the common line CL through common contact holes 160a that are formed by selectively removing the gate insulating film 120, the first and second insulating films 150a and 150b and the third insulating films 170. In particular, connecting the common electrode 160 to the common line CL through the plurality of common contact holes 160a may prevent delay of common voltage. In this case, the common electrode 160 is a unitary electrode formed over the entire surface of the lower substrate to have openings in regions corresponding to the respective TFTs.

The common electrode 160, similar to the pixel electrode 180, is formed of a transparent conductive material.

More particularly, the pixel electrode 180 takes the form of a plurality of slits and creates a fringe field with the common electrode 160 with the third insulating film 170 interposed therebetween. The fringe field causes rotation of liquid crystal molecules by dielectric anisotropy. Transmittance of light through unit pixels varies based on the degree of rotation of liquid crystal molecules, resulting in realization of images.

That is, with the liquid crystal display device according to the second embodiment of the present invention as described above, it is possible to minimize a reduction in aperture ratio due to common lines owing to providing the single common line CL parallel to the gate lines GL only at the center of the lower substrate 100. Further, with the configuration in which the TFTs for a group of the upper unit pixels located in the upper portion of the lower substrate 100 on the basis of the common line CL are formed at the upper side of the respective upper unit pixels, and the TFTs for a group of the lower unit pixels located in the lower portion of the lower substrate 100 on the basis of the common line CL are formed at the lower side of the respective lower unit pixels, no TFTs and no gate lines GL are present between the unit pixels at a position where the common line CL is formed, which may effectively enhance an aperture ratio and transmittance.

Hereinafter, a method of fabricating the liquid crystal display device according to the second embodiment of the present invention will be described with reference to the accompanying drawings.

Figure 7A:
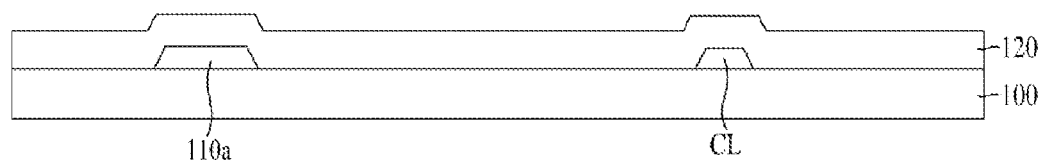
FIGS. 7A to 7F are sectional views illustrating sequential operations of a method of fabricating a liquid crystal display device according to the second embodiment of the present invention.

As illustrated in FIG. 7A, the plurality of gate lines (not shown) having gate electrodes 110a and the single common line CL are formed on the lower substrate 100. In this case, the common line CL is formed at the center of the lower substrate 100, and is arranged parallel to the plurality of gate lines (not shown). The gate electrode 110a may protrude from the gate line (not shown), or may be defined as a partial region of the gate line (not shown).

Figure 7B:
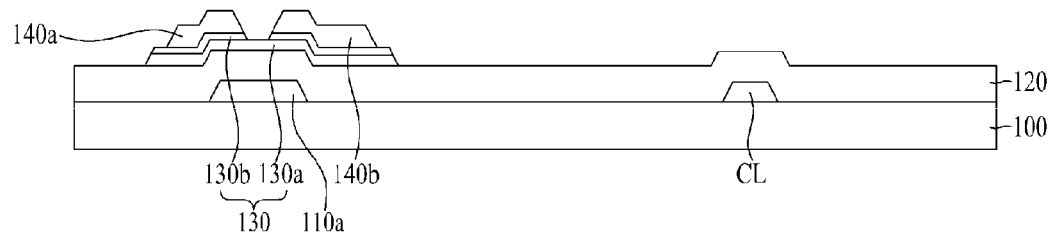

Next, as illustrated in FIG. 7B, the gate insulating film 120 is formed on the entire surface of the lower substrate 100 including the gate line (not shown), gate electrode 110a and the common line CL. Then, the semiconductor layer 130 in the form of a stack of the active layer 130a and the ohmic contact layer 130b is formed on the insulating film 120 over the gate electrode 110a. Then, the data lines (not shown) and the source and drain electrodes 140a and 140b spaced apart from each other are formed on the semiconductor layer 130. In this case, when using a half tone mask or a diffractive exposure mask, the semiconductor layer 130, the source and drain electrodes 140a and 140b and the data lines (not shown) may be simultaneously formed.

In this case, the plurality of data lines (not shown) and gate lines (GL) are formed to orthogonally intersect each other such that the plurality of unit pixels is defined at intersections of the data lines (not shown) and the gate lines (not shown). In this way, the TFT including the gate electrode 110a, the gate insulating film 120, the semiconductor layer 130, and the source and drain electrodes 140a and 140b is formed.

In the above described liquid crystal display device according to the second embodiment of the present invention in which the single common line CL is formed at the center of the lower substrate 100, it is preferable that the TFTs for a first group of unit pixels located in the right portion of the lower substrate 100 on the basis of the common line CL be formed at the right side of the respective upper unit pixels of the first group, and the TFTs for a second group of unit pixels located in the left portion of the lower substrate 100 on the basis of the common line CL be formed at the left side of the respective lower unit pixels of the second group.

Accordingly, only the single common line CL is formed between the first group of unit pixels and the second group of unit pixels, which may contribute to effectively enhance an aperture ratio and transmittance.

Figure 7C:
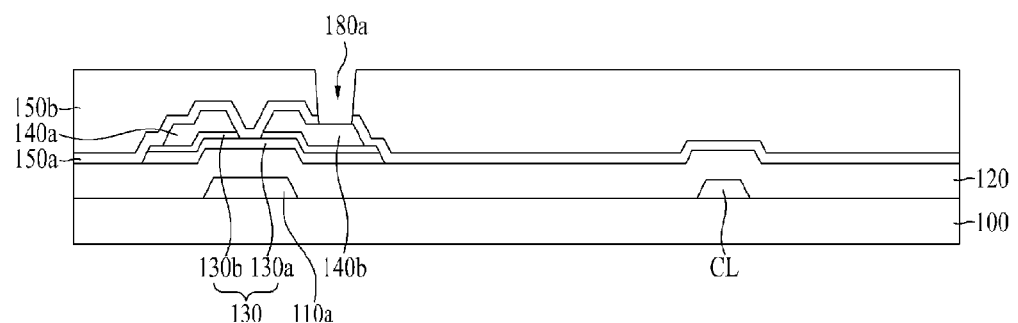

Next, as illustrated in FIG. 7C, the first and second insulating films 150a and 150b are formed on the entire surface of the gate insulating film 120 including the TFT. The first and second insulating films 150a and 150b are selectively removed to expose the drain electrode 140b to form the drain contact hole 180a.

Figure 7D:
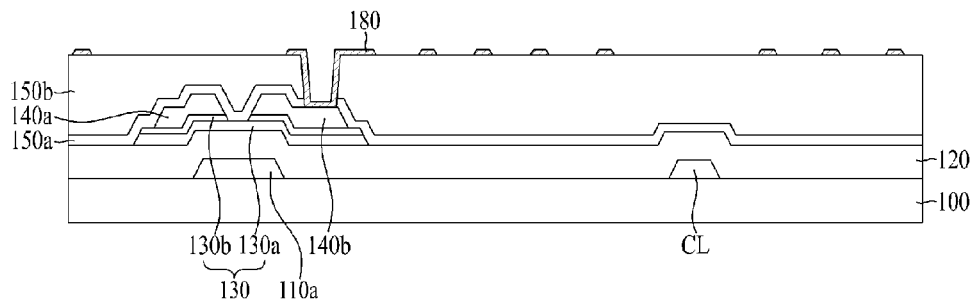

As illustrated in FIG. 7D, a transparent conductive material, such as Tin Oxide (TO), Indium Tin Oxide (ITO), Indium Zinc Oxide (IZO), and Indium Tin Zinc Oxide (ITZO), for example, is deposited over the entire surface of the second insulating film 150b including the drain contact hole 180a. Then, the transparent conductive material is patterned to form the pixel electrode 180. the pixel electrode 180 is formed in the form of slits, and is connected to the drain electrode 140b through the drain contact hole 180a.

Figure 7E:
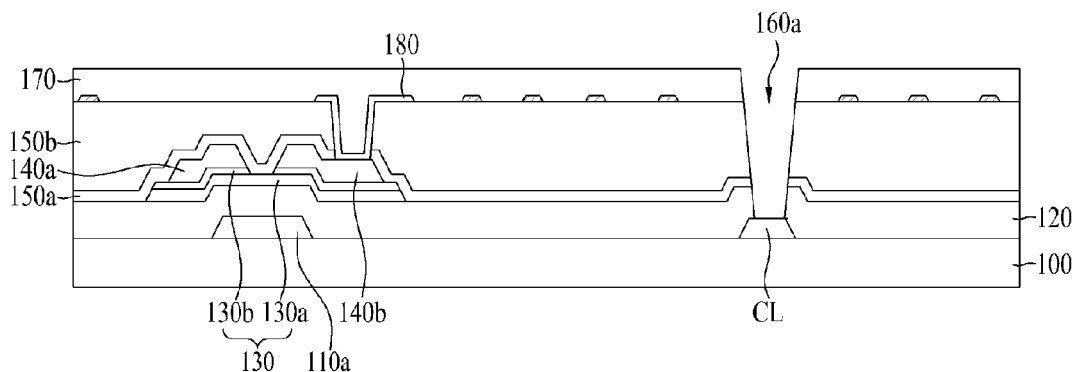
Figure 7F:
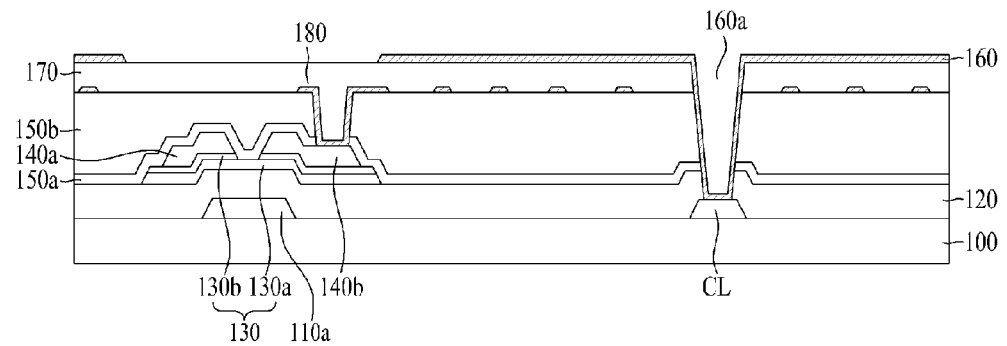

Next, as illustrated in FIG. 7E, the third insulating film 170 is formed over the entire surface of the second insulating film 150b containing the pixel electrode 180. The gate insulating film 120 and the first to third insulating films 150a, 150b and 170 are is selectively removed to expose the common line CL to form a common contact hole 160a. Next, as illustrated in FIG. 7F, a transparent conductive material as described above is deposited on the third insulating film 170 including the common contact hole 160a, and is patterned to form the common electrode 160. The common electrode 160 is connected to the common line CL through the common contact hole 160a such that common voltage is applied to the common electrode 160. The common electrode 160 is a unitary electrode having openings corresponding to the respective TFTs. The pixel electrode 180 overlaps the common electrode 160 with the third insulating film 170 interposed therebetween to create a fringe field.

Figure 4A:
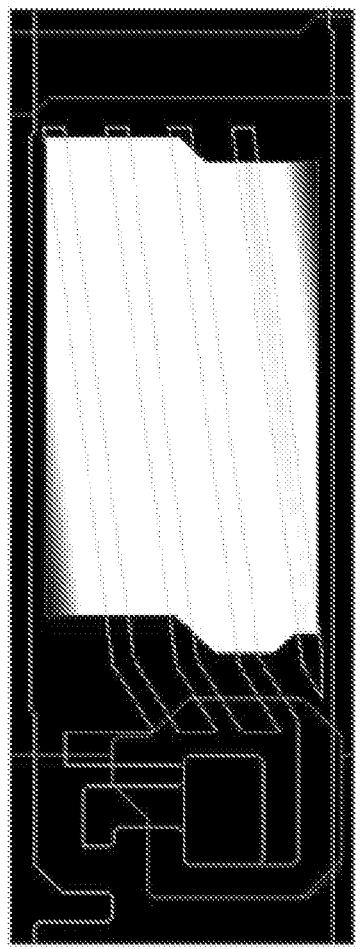
FIGS. 4A and 4B are plan views respectively illustrating an opening of a unit pixel of the conventional liquid crystal display device or of the liquid crystal display device of the present invention.
Figure 4B:
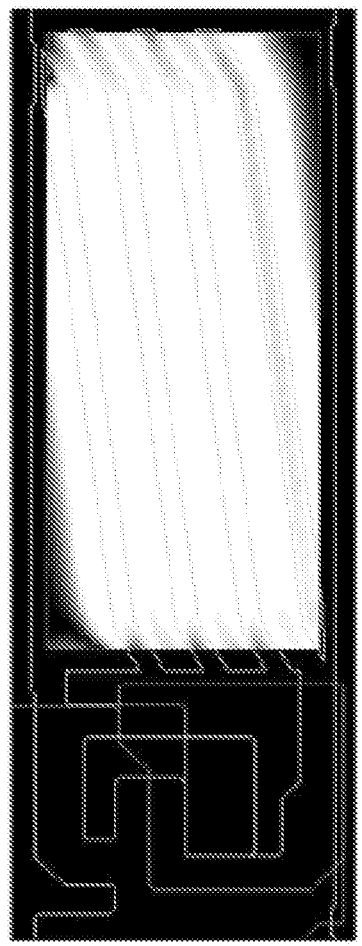
Figure 5:
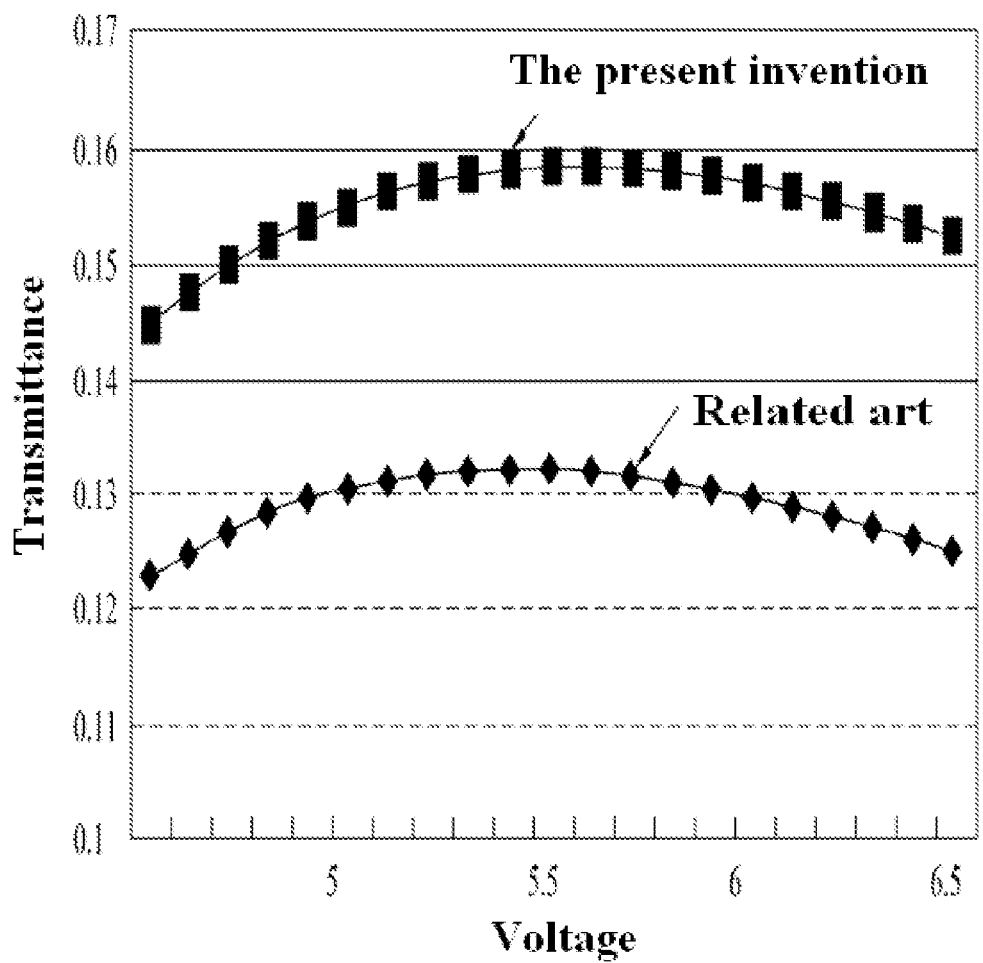
FIG. 5 is a graph illustrating transmittances of unit pixels of the conventional liquid crystal display device and the liquid crystal display device of the present invention.

FIGS. 4A and 4B are plan views respectively illustrating an opening of a unit pixel of the conventional liquid crystal display device or of the liquid crystal display device of the present invention, and FIG. 5 is a graph illustrating transmittances of unit pixels of the conventional liquid crystal display device and the liquid crystal display device of the present invention.

The conventional liquid crystal display device includes the common lines equal in number to the gate lines. Thus, as illustrated in FIG. 4A, an opening of a unit pixel is reduced by an area of the common line.

However, in the case of the liquid crystal display device of the present invention as described above, the single common line is formed only at the center of the lower substrate, and the TFTs in the right portion of the lower substrate on the basis of the common line are formed at the right side of the respective upper unit pixels of the first group and the TFTs in the left portion of the lower substrate on the basis of the common line are formed at the left side of the respective lower unit pixels of the second group. With this configuration, as illustrated in FIG. 4B, the common line is not formed within the unit pixel.

Accordingly, the liquid crystal display device of the present invention is increased in aperture ratio by an area of the common line formed in the unit pixel of the conventional liquid crystal display device. Thus, the liquid crystal display device of the present invention achieves about 20% greater transmittance than the conventional liquid crystal display device when a pixel density of 218 ppi (pixels per inch) is given.

In particular, the liquid crystal display device of the present invention is applicable to a large-area display device. A small-area liquid crystal display device does not cause delay when common lines are removed and common voltage is directly applied to common electrodes. However, as the area of the liquid crystal display device increases, the image quality is more deteriorated because of a common voltage deviation between unit pixels when common voltage is directly applied to common electrodes.

As is apparent from the above description, a liquid crystal display device and a method of fabricating the same according to the present invention have the following effects.

First, a conventional high-resolution display device has a smaller area of unit pixel than a low-resolution display device, and therefore suffers from a considerable deterioration in aperture ratio and transmittance if common lines equal in number to gate lines are formed. However, the liquid crystal display device of the present invention is configured such that a single common line parallel to a plurality of gate lines is formed only at the center of a lower substrate. This configuration may prevent deterioration in aperture ratio.

Second, according to the present invention, TFTs for the first group of unit pixels located in a right portion of the lower substrate on the basis of the single common line are formed at the right side of the respective unit pixels of the first group, and TFTs for the second group of unit pixels located in a left portion of the lower substrate on the basis of the single common line are formed at the left side of the respective unit pixels of the second group. Accordingly, no TFTs and no gate lines are present between the unit pixels at a position where the common line is formed, and no common line is located in each unit pixel, which causes effective enhancement in aperture ratio and transmittance.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:
1. A liquid crystal display device comprising:
a single common line located at a center of a substrate;
a first group of unit pixels located in a right portion of the substrate on the basis of the common line and a second group of unit pixels located in a left portion of the substrate on the basis of the common line, each unit pixel defined by a plurality of gate lines and data lines orthogonally intersecting each other; and a plurality of thin film transistors formed at a right side of the respective unit pixels of the first group and at a left side of the respective unit pixels of the second group, wherein each unit pixel includes:

a thin film transistor formed on the lower substrate;

at least one of insulating film on the substrate including the thin film transistor;

a pixel electrode formed on the at least one of insulating film to connect to the thin film transistor on a per unit pixel basis;

a third insulating film formed over the pixel electrode; and a common electrode on the third insulating film to contact to the single common line, wherein the common electrode is formed over the entire surface of the lower substrate to have an opening corresponding to the thin film transistor.

2. The device according to claim 1, wherein, each gate line is located at the right side of the respective unit pixels in the first group of unit pixels, and each gate line is located at the left side of the respective unit pixels in the second group of unit, wherein the gate lines are parallel to the single common line.

3. The device according to claim 1, wherein the pixel electrode and the common electrode create a fringe field therebetween with the third insulating film.

4. The device according to claim 3, wherein the pixel electrodes or the common electrode is formed in a form of slits.

* * * * *